US011335787B2

(12) United States Patent
Sakano et al.

(10) Patent No.: US 11,335,787 B2
(45) Date of Patent: May 17, 2022

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Tatsunori Sakano, Shinagawa Tokyo (JP); Ryohei Gejo, Kawasaki Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/014,235

(22) Filed: Sep. 8, 2020

(65) Prior Publication Data

US 2021/0126100 A1 Apr. 29, 2021

(30) Foreign Application Priority Data

Oct. 25, 2019 (JP) .............................. JP2019-194470

(51) Int. Cl.
*H01L 29/423* (2006.01)
*H01L 29/417* (2006.01)
*H01L 29/739* (2006.01)

(52) U.S. Cl.
CPC .... *H01L 29/4238* (2013.01); *H01L 29/41708* (2013.01); *H01L 29/4236* (2013.01); *H01L 29/7397* (2013.01)

(58) Field of Classification Search
CPC .................................................. H01L 29/4238

(Continued)

(56) References Cited

U.S. PATENT DOCUMENTS

2005/0258493 A1* 11/2005 Aono .................. H01L 29/7397
257/370
2007/0170549 A1* 7/2007 Tsuzuki .............. H01L 29/0834
257/565

(Continued)

FOREIGN PATENT DOCUMENTS

JP 5206096 B2 6/2013
JP 5568922 B2 8/2014

(Continued)

*Primary Examiner* — Igwe U Anya
(74) *Attorney, Agent, or Firm* — Finnegan, Henderson, Farabow, Garrett & Dunner L.L.P.

(57) ABSTRACT

A semiconductor device includes first and second electrodes, a semiconductor part between the first and second electrodes, first to third control electrodes between the semiconductor part and the first electrode, first and second control terminals electrically connected respectively to the first and second control electrodes. The first to third control electrodes each are provided in a trench of the semiconductor part. The third control electrode is provided between the first and second control electrodes. The semiconductor part includes first and third layers of a first conductivity type, and second and fourth layers of a second conductivity type. The second layer is provided between the first layer and the first electrode. The third layer is selectively provided between the second layer and the first electrode. The fourth layer is provided between the first layer and the second electrode. The first electrode is electrically connected to the second and third layers.

20 Claims, 6 Drawing Sheets

(58) Field of Classification Search
USPC .......................................................... 257/139
See application file for complete search history.

(56) References Cited

U.S. PATENT DOCUMENTS

| 2010/0039844 | A1* | 2/2010 | Arai .................... H01L 29/0839 |
| | | | 363/131 |
| 2015/0207407 | A1* | 7/2015 | Nishiwaki ........... H01L 27/0203 |
| | | | 323/271 |
| 2017/0012551 | A1* | 1/2017 | Kondo ................ H01L 29/0696 |
| 2018/0308757 | A1 | 10/2018 | Kakimoto |

FOREIGN PATENT DOCUMENTS

| JP | 2016-92163 A | 5/2016 |
| JP | 6414090 B2 | 10/2018 |

* cited by examiner

SEMICONDUCTOR DEVICE

CROSS-REFERENCE TO RELATED APPLICATIONS

This application is based upon and claims the benefit of priority from Japanese Patent Application No. 2019-194470, filed on Oct. 25, 2019; the entire contents of which are incorporated herein by reference.

FIELD

Embodiments relate to a semiconductor device.

BACKGROUND

It is desirable to reduce the on-state conduction loss and the turn-off switching loss in a power semiconductor device.

DETAILED DESCRIPTION

Figure 1:
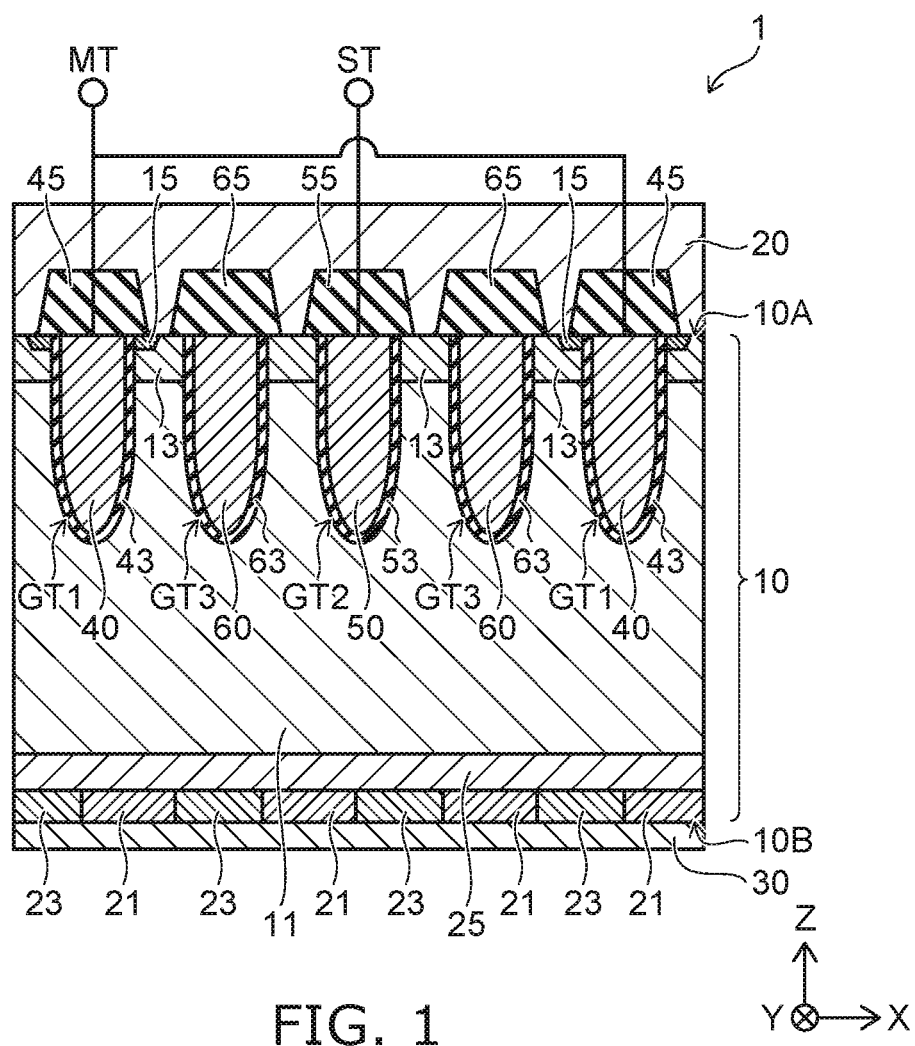
FIG. 1 is a schematic cross-sectional view showing a semiconductor device according to an embodiment.

According to one embodiment, a semiconductor device includes a semiconductor part, first and second electrodes, first to third control electrode and first and second control terminals. The semiconductor part includes a first surface and a second surface, the second surface being at a side opposite to the first surface. The semiconductor part has first to third trenches provided in the first surface side of the semiconductor part. The first electrode is provided on the first surface of the semiconductor part. The second electrode is provided on the second surface of the semiconductor part. The first control electrode is provided between the semiconductor part and the first electrode, the first control electrode being provided in the first trench and electrically insulated from the semiconductor part by a first insulating film. The second control electrode is provided between the semiconductor part and the first electrode, the second control electrode being provided in a second trench and electrically insulated from the semiconductor part by a second insulating film. The third control electrode is provided between the semiconductor part and the first electrode, the third control electrode being provided in a third trench and electrically insulated from the semiconductor part by a third insulating film. The third control electrode is electrically isolated from the first and second control electrodes. The first control terminal is apart from the first electrode on the first surface of the semiconductor part, the first control terminal being electrically connected to the first control electrode and electrically insulated from the semiconductor part. The second control terminal is apart from the first electrode and the first control terminal on the first surface of the semiconductor part, the second control terminal being electrically connected to the second control electrode and electrically insulated from the semiconductor part. The first to third control electrodes are arranged in a direction along the first surface of the semiconductor part. The third control electrode is provided between the first control electrode and the second control electrode. The semiconductor part includes a first semiconductor layer of a first conductivity type, a second semiconductor layer of a second conductivity type, a third semiconductor layer of the first conductivity type, and a fourth semiconductor layer of the second conductivity type. The second semiconductor layer is provided between the first semiconductor layer and the first electrode, the second semiconductor layer including a portion facing the first control electrode via the first insulating film, a portion facing the second control electrode via the second insulating film, and a portion facing the third control electrode via the third insulating film. The third semiconductor layer is selectively provided between the second semiconductor layer and the first electrode, the third semiconductor layer contacting the first insulating film. The fourth semiconductor layer is provided between the first semiconductor layer and the second electrode. The first electrode is electrically insulated from the first control electrode by a fourth insulating film and electrically insulated from the second control electrode by a fifth insulating film. The first electrode is electrically connected to the second and third semiconductor layers. The second electrode is electrically connected to the fourth semiconductor layer.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a schematic cross-sectional view showing a semiconductor device 1 according to an embodiment. The semiconductor device 1 is, for example, a reverse-conducting IGBT (Insulated Gate Bipolar Transistor).

The semiconductor device 1 includes a semiconductor part 10, a first electrode 20, and a second electrode 30. The semiconductor part 10 is, for example, silicon. The first electrode 20 is, for example, an emitter electrode. The first electrode 20 is provided on a first surface 10A of the semiconductor part 10. The first electrode 20 is, for example, a metal layer including tungsten (W) and aluminum (Al). The second electrode 30 is, for example, a collector electrode. The second electrode 30 is provided on a second surface 10B of the semiconductor part 10. The second electrode 30 is, for example, a metal layer including titanium (Ti) or aluminum (Al). The second surface 10B is, for example, the back surface of the semiconductor part 10 and is positioned at the side opposite to the first surface 10A.

The semiconductor device 1 further includes a first control electrode 40, a second control electrode 50, and a third control electrode 60. The first control electrode 40, the second control electrode 50, and the third control electrode 60 are provided between the semiconductor part 10 and the first electrode 20. The first control electrode 40, the second control electrode 50, and the third control electrode 60 are, for example, conductive polysilicon.

The first control electrode 40 is located inside a first trench GT1 provided at the first surface 10A side of the semiconductor part 10. The first control electrode 40 is electrically insulated from the semiconductor part 10 by a first insulating film 43. The first insulating film 43 is, for example, a silicon oxide film.

The second control electrode 50 is located inside a second trench GT2 provided at the first surface 10A side of the semiconductor part 10. The second control electrode 50 is electrically insulated from the semiconductor part 10 by a second insulating film 53. The second insulating film 53 is, for example, a silicon oxide film.

The third control electrode 60 is located inside a third trench GT3 provided at the first surface 10A side of the semiconductor part 10. The third control electrode 60 is electrically insulated from the semiconductor part 10 by a third insulating film 63. The third insulating film 63 is, for example, a silicon oxide film.

The semiconductor part 10 includes a first-conductivity-type (hereinbelow, an n-type) first semiconductor layer 11, a second-conductivity-type (hereinbelow, a p-type) second semiconductor layer 13, an n-type third semiconductor layer 15, a p-type fourth semiconductor layer 21, an n-type fifth semiconductor layer 23, and an n-type sixth semiconductor layer 25.

The first semiconductor layer 11 is, for example, an n-type drift layer. The first semiconductor layer 11 includes, for example, an n-type impurity with a low concentration ($1 \times 10^{15}$ to $1 \times 10^{16}$ cm$^{-3}$).

The second semiconductor layer 13 is, for example, a p-type base layer. The second semiconductor layer 13 is provided between the first semiconductor layer 11 and the first electrode 20. The second semiconductor layer 13 includes, for example, a p-type impurity with a concentration range of $5 \times 10^{16}$ to $5 \times 10^{17}$ cm$^{-3}$.

The second semiconductor layer 13 faces the first control electrode 40 via the first insulating film 43 and faces the second control electrode via the second insulating film 53. The second semiconductor layer 13 also faces the third control electrode 60 via the third insulating film 63.

The third semiconductor layer 15 is, for example, an n-type emitter layer. The third semiconductor layer 15 is selectively provided between the second semiconductor layer 13 and the first electrode 20. The third semiconductor layer is located at a position contacting the first insulating film 43. The third semiconductor layer 15 includes an n-type impurity with a higher concentration than the n-type impurity of the first semiconductor layer 11. For example, the first electrode 20 is in contact with and electrically connected to the third semiconductor layer 15.

The first electrode 20 also is electrically connected to the second semiconductor layer 13. For example, the first electrode 20 may contact a not-illustrated p-type contact layer (referring to FIG. 5) and may be electrically connected to the second semiconductor layer 13 via the p-type contact layer. The p-type contact layer is selectively provided between the second semiconductor layer 13 and the first electrode 20 and includes a p-type impurity with a higher concentration than the p-type impurity of the second semiconductor layer 13.

The fourth semiconductor layer 21 is, for example, a p-type collector layer. The fourth semiconductor layer 21 is selectively provided between the first semiconductor layer 11 and the second electrode 30. The fourth semiconductor layer 21 includes, for example, a p-type impurity with the same concentration level as the p-type impurity of the second semiconductor layer 13.

The fifth semiconductor layer 23 is, for example, an n-type cathode layer. The fifth semiconductor layer 23 is selectively provided between the first semiconductor layer 11 and the second electrode 30. The fifth semiconductor layer 23 includes an n-type impurity with a higher concentration than the n-type impurity of the first semiconductor layer 11.

The fourth semiconductor layer 21 and the fifth semiconductor layer 23 are alternately arranged along the second electrode 30. The second electrode 30 is electrically connected to the fourth and fifth semiconductor layers 21 and 23. Also, the second electrode 30 is electrically connected to the first semiconductor layer 11 via the fifth semiconductor layer 23.

The sixth semiconductor layer 25 is, for example, an n-type buffer layer. The sixth semiconductor layer 25 is provided between the first semiconductor layer 11 and the fourth semiconductor layer 21. The sixth semiconductor layer 25 includes an n-type impurity with a higher concentration than the n-type impurity of the first semiconductor layer 11.

The first control electrode 40 is electrically insulated from the first electrode 20 by a fourth insulating film 45. The fourth insulating film 45 is, for example, a silicon oxide film. For example, the first control electrode 40 is electrically connected to a first control terminal MT. The first control electrode 40 is electrically isolated from the second and third control electrodes 50 and 60 and is independently biased.

The second control electrode 50 is electrically insulated from the first electrode 20 by a fifth insulating film 55. The fifth insulating film 55 is, for example, a silicon oxide film. For example, the second control electrode 50 is electrically connected to a second control terminal ST. The second control electrode 50 is electrically isolated from the first and third control electrodes 40 and 60 and is independently biased.

For example, the third control electrode 60 is electrically connected to the first electrode 20. For example, a sixth insulating film 65 is provided between the first electrode 20 and the third control electrode 60. The sixth insulating film 65 is, for example, a silicon oxide film. The first electrode 20 is electrically connected to the third control electrode 60 via a contact portion that extends through the sixth insulating film 65 and reaches the third control electrode 60 (referring to FIG. 2).

A configuration may be used in which the first electrode 20 is directly connected to the third control electrode 60 without providing the sixth insulating film 65. Also, a structure may be used in which a control terminal is provided on the first surface 10A of the semiconductor part 10, is connected to the third control electrode 60, is electrically isolated from the first electrode 20, and can be independently biased.

Figure 2:
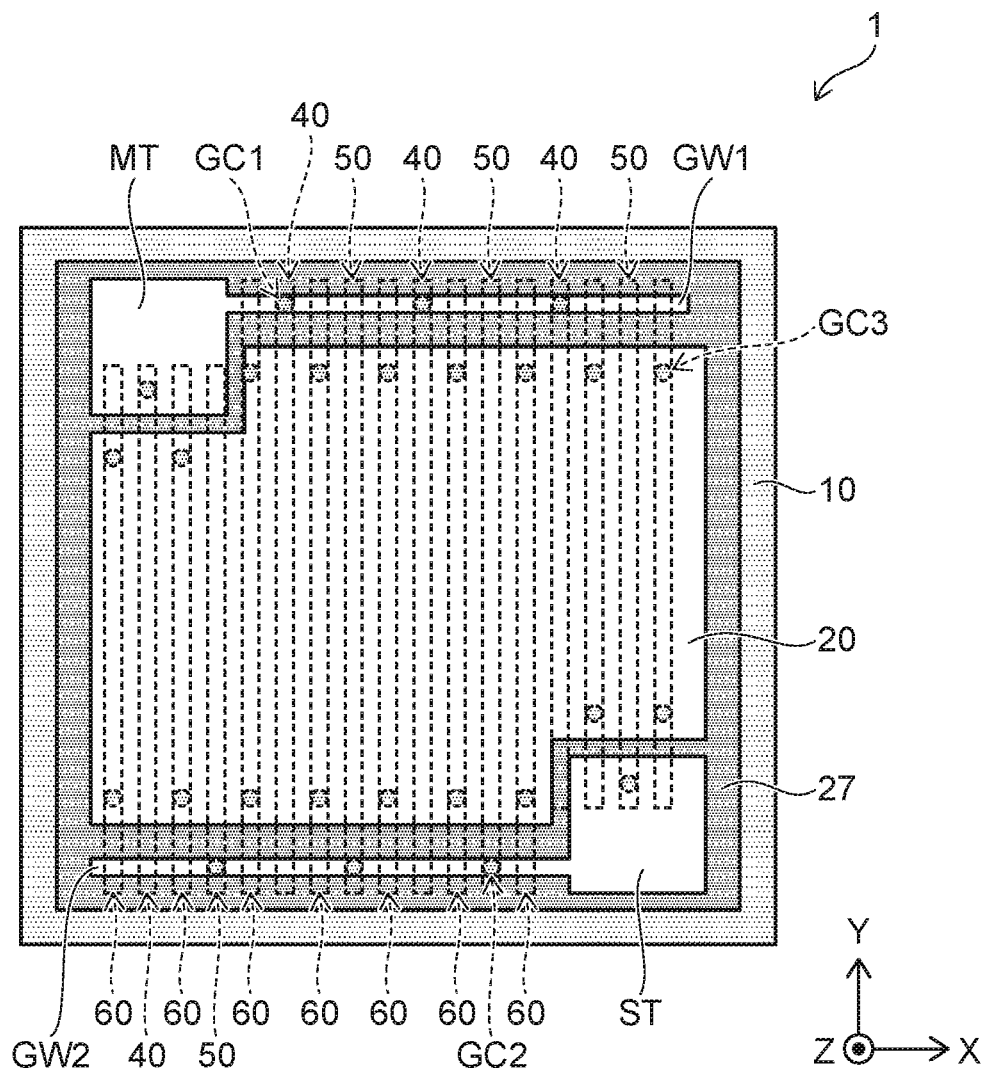
FIG. 2 is a schematic plan view showing the semiconductor device according to the embodiment.

FIG. 2 is a schematic plan view showing the semiconductor device 1 according to the embodiment. FIG. 2 is a schematic view showing the arrangement of the first electrode 20, the first control terminal MT, and the second control terminal ST.

The first control terminal MT and the second control terminal ST are, for example, gate pads. For example, the first control terminal MT and the second control terminal ST are electrically insulated from the semiconductor part 10 by a seventh insulating film 27. The seventh insulating film 27 is, for example, a silicon oxide film.

As shown in FIG. 2, the semiconductor device 1 further includes a first control interconnect GW1 and a second control interconnect GW2. For example, the first control interconnect GW1 is connected to the first control terminal MT and extends in the X-direction. For example, the second control interconnect GW2 is connected to the second control terminal ST and extends in the X-direction. For example, the first control interconnect GW1 and the second control interconnect GW2 are electrically insulated from the semiconductor part 10 by the seventh insulating film.

The first control terminal MT and the first control interconnect GW1 are separated from the first electrode 20, the second control terminal ST, and the second control interconnect GW2. The second control terminal ST and the second control interconnect GW2 are separated from the first electrode 20. For example, the first electrode 20 is located between the first control terminal MT and the second control terminal ST and between the first control interconnect GW1 and the second control interconnect GW2.

As shown by the broken lines in FIG. 2, for example, the first control electrode 40, the second control electrode 50, and the third control electrode 60 extend in the Y-direction below the first electrode 20. The first control electrode 40 crosses the first control terminal MT or the first control interconnect GW1. The second control electrode 50 crosses the second control terminal ST or the second control interconnect GW2.

For example, the first control electrode 40 is electrically connected to the first control terminal MT or the first control interconnect GW1 via a first contact portion GC1. The first contact portion GC1 is provided where the first control electrode 40 crosses the first control terminal MT or the first control interconnect GW1. The first contact portion GC1 extends through the seventh insulating film from the first control terminal MT or the first control interconnect GW1 and is connected to the first control electrode 40. The first contact portion GC1 is, for example, a portion of the first control terminal MT or the first control interconnect GW1 that extends into a contact hole provided in the seventh insulating film.

For example, the second control electrode 50 is electrically connected to the second control terminal ST or the second control interconnect GW2 via a second contact portion GC2. The second contact portion GC2 is provided where the second control electrode 50 crosses the second control terminal ST or the second control interconnect GW2. The second contact portion GC2 extends through the seventh insulating film from the second control terminal ST or the second control interconnect GW2 and is connected to the second control electrode 50. The second contact portion GC2 is, for example, a portion of the second control terminal ST or the second control interconnect GW2 that extends into a contact hole provided in the seventh insulating film.

For example, the third control electrode 60 is electrically connected to the first electrode 20 via a third contact portion GC3. The third contact portion GC3 extends through the sixth insulating film 65 from the first electrode 20 and is connected to the third control electrode 60. The third contact portion GC3 is, for example, a portion of the first electrode 20 that extends into a contact hole provided in the sixth insulating film 65.

Figure 3A:
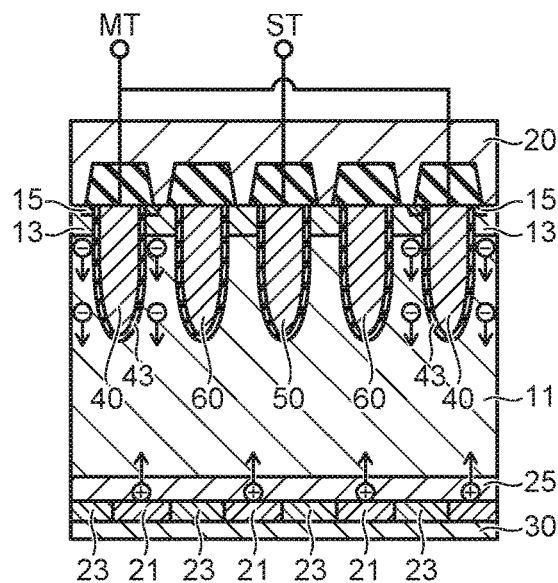
FIGS. 3A to 3C are schematic cross-sectional views showing operations of the semiconductor device according to the embodiment.
Figure 3B:
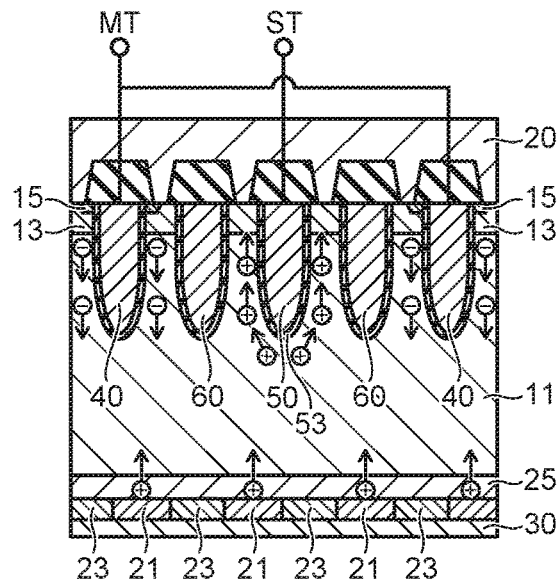
Figure 3C:
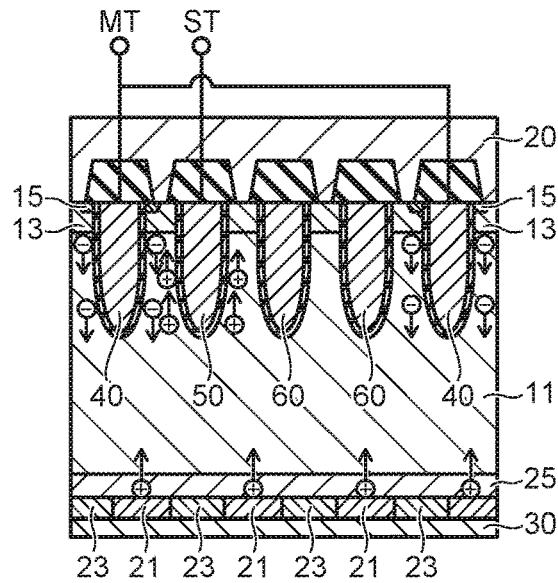

FIGS. 3A and 3B are schematic cross-sectional views showing operations of the semiconductor device 1 according to the embodiment. FIG. 3C is a schematic cross-sectional view showing an operation of a semiconductor device 2 according to a comparative example. FIGS. 3A to 3C show the movement of charge in the on-state when the semiconductor devices 1 and 2 are operated in an IGBT mode.

In the example shown in FIG. 3A, a gate voltage that is greater than the threshold voltage of the first control electrode 40 is applied to the first control terminal MT. Thereby, an on-voltage is supplied to the first control electrode 40, and an n-type inversion layer (not illustrated) is induced at the interface between the second semiconductor layer 13 and the first insulating film 43. Therefore, electrons are injected from the first electrode 20 into the first semiconductor layer 11 via the third semiconductor layer 15 and the n-type inversion layer. Accordingly, holes are injected from the fourth semiconductor layer 21 into the first semiconductor layer 11. As a result, the densities of the holes and electrons in the first semiconductor layer 11 are increased, and the on-resistance for the collector current flowing from the second electrode 30 toward the first electrode 20 is reduced.

Thus, the semiconductor device 1 is advantageous in that the densities of the holes and electrons in the first semiconductor layer 11 are increased and the on-resistance is reduced in the IGBT mode, but disadvantageous in that the turn-off period for the semiconductor device 1 to transition to the off-state lengthens, and the switching loss increases.

FIG. 3B illustrates a method for controlling the second control electrode 50 performed before the semiconductor device 1 transitions from the on-state to the off-state. For example, a negative voltage is applied to the second control electrode 50 via the second control terminal ST, and a p-type inversion layer (not illustrated) is induced at the interface between the first semiconductor layer 11 and the second insulating film 53. An ejection path of holes from the first semiconductor layer 11 to the first electrode 20 is formed thereby, and the ejection of the holes is promoted. As a result, the densities of the holes and electrons in the first semiconductor layer 11 can be reduced.

In other words, a negative voltage is applied to the second control electrode 50 before an off-voltage that is not more than the threshold voltage is applied to the first control electrode 40. The densities of the holes and electrons in the first semiconductor layer 11 can be reduced thereby, and the turn-off time until the first semiconductor layer 11 is depleted can be reduced.

In the semiconductor device 1 according to the embodiment, the third control electrode 60 is located between the first control electrode 40 and the second control electrode 50. On the other hand, in the semiconductor device 2 shown in FIG. 3C, the first control electrode 40 and the second control electrode 50 are located adjacent to each other.

As shown in FIG. 3C, a depletion layer spreads in the direction of the first control electrode 40 from the second control electrode 50 when a negative voltage is applied to the second control electrode 50 in the state in which the on-voltage is applied to the first control electrode 40. Therefore, the path of the electrons in the first semiconductor layer 11 positioned between the first control electrode 40 and the second control electrode 50 becomes narrow, and the on-resistance increases. In other words, in the semiconductor device 2, the conduction loss is increased by operating the second control electrode 50.

Conversely, in the semiconductor device 1, the third control electrode 60 is located between the first control electrode 40 and the second control electrode 50. Therefore, the ejection of the holes can be promoted by the second control electrode 50 without making the path of the electrons narrow between the first control electrode 40 and the third control electrode 60.

Thus, in the semiconductor device 1, by appropriately controlling the timing of reducing the gate voltage applied to the first control terminal MT to be not more than the threshold voltage and the timing of applying the negative voltage to the second control terminal ST, the switching loss can be reduced while suppressing the increase of the conduction loss.

Figure 4A:
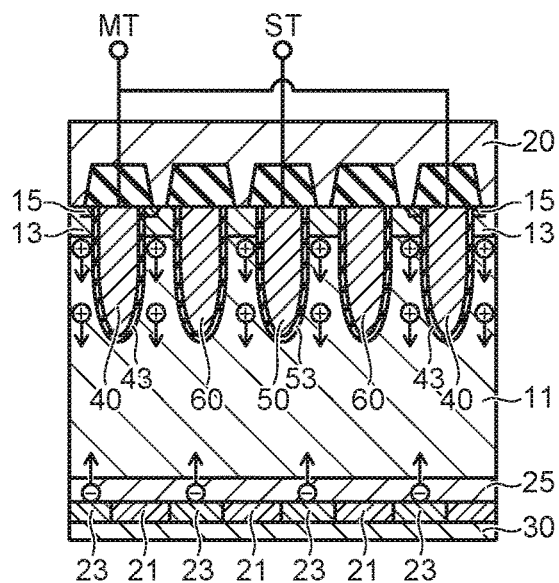
FIGS. 4A to 4C are schematic cross-sectional views showing other operations of the semiconductor device according to the embodiment.
Figure 4B:
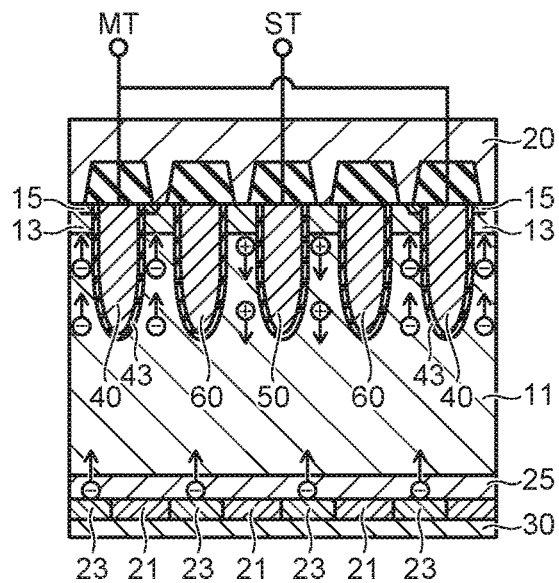
Figure 4C:
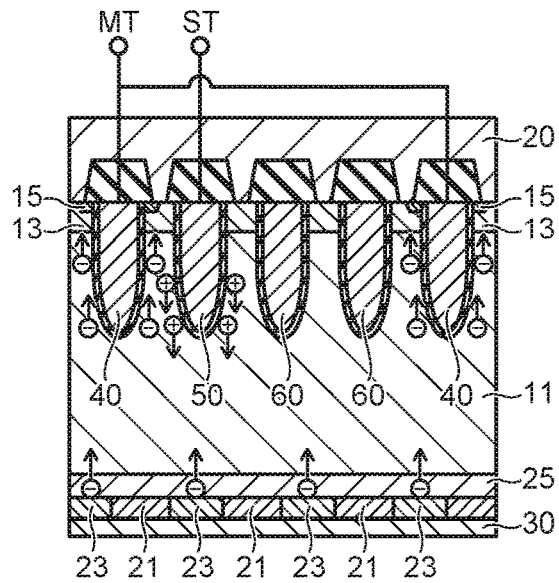

FIGS. 4A and 4B are schematic cross-sectional views showing other operations of the semiconductor device 1 according to the embodiment. FIG. 4C is a schematic cross-sectional view showing another operation of the semiconductor device 2 according to the comparative example. FIGS. 4A to 4C show the movement of charge when the semiconductor devices 1 and 2 are operated in a diode mode.

In the diode mode shown in FIG. 4A, the p-n junction between the first semiconductor layer 11 and the second semiconductor layer 13 is forward-biased, and holes are injected from the second semiconductor layer 13 into the first semiconductor layer 11. Accordingly, electrons are injected from the fifth semiconductor layer 23 into the first semiconductor layer 11.

Also, a negative voltage is applied to the first and second control electrodes 40 and 50 via the first control terminal MT and the second control terminal ST. Thereby, p-type inversion layers (not illustrated) are induced at the interface between the first semiconductor layer 11 and the first insulating film 43 and the interface between the first semiconductor layer 11 and the second insulating film 53, and injection of the holes from the second semiconductor layer 13 into the first semiconductor layer 11 can be promoted. As a result, the densities of the holes and electrons in the first semiconductor layer 11 are increased, and the on-resistance can be reduced.

Continuing, a positive voltage that is greater than the threshold voltage is applied to the first control electrode 40 via the first control terminal MT, and an n-type inversion layer (not illustrated) is induced at the interface between the second semiconductor layer 13 and the first insulating film 43. Thereby, an ejection path of the electrons via the n-type inversion layer and the third semiconductor layer 15 is formed between the first semiconductor layer 11 and the first electrode 20.

As shown in FIG. 4B, the ejection of the electrons from the first semiconductor layer 11 into the first electrode 20 is promoted, and the densities of the holes and electrons in the first semiconductor layer 11 are reduced. In other words, the densities of the holes and electrons in the first semiconductor layer 11 can be reduced before transitioning from the diode mode to the IGBT mode. The recovery time in the diode mode can be reduced thereby, and the switching loss can be reduced.

Also, the recovery current when transitioning to the IGBT mode can be reduced by reducing the densities of the holes and electrons in the diode mode of the first semiconductor layer 11. For example, in an inverter circuit configured using the semiconductor device 1, when the semiconductor device 1 that is provided in one arm transitions from the diode mode to the IGBT mode, one of the semiconductor devices 1 that is provided in an arm at the opposite side is turned-on in the IGBT mode. At this time, the turn-on loss of the semiconductor device 1 provided at the opposite side can be reduced by reducing the recovery current in the diode mode of the semiconductor device 1 provided in the one arm.

As shown in FIG. 4C, when the first control electrode 40 and the second control electrode 50 are arranged adjacent to each other, a depletion layer spreads in the direction of the first control electrode 40 from the second control electrode 50 when a positive voltage is applied to the first control electrode 40 and a negative voltage is applied to the second control electrode 50. Therefore, the ejection path of the electrons is narrow in the first semiconductor layer 11 positioned between the first control electrode 40 and the second control electrode 50. As a result, there are cases where the densities of the holes and electrons in the first semiconductor layer 11 cannot be sufficiently decreased, and the reduction effect of the switching loss is not obtained.

Conversely, in the semiconductor device 1, because the third control electrode 60 is located between the first control electrode 40 and the second control electrode 50, the electrons can be ejected from the first semiconductor layer 11 to the first electrode 20 without being affected by the second control electrode 50. The voltage that is applied to the first and second control electrodes 40 and 50 is appropriately controlled thereby, and it becomes easy to reduce the conduction loss and the switching loss.

Figure 5:
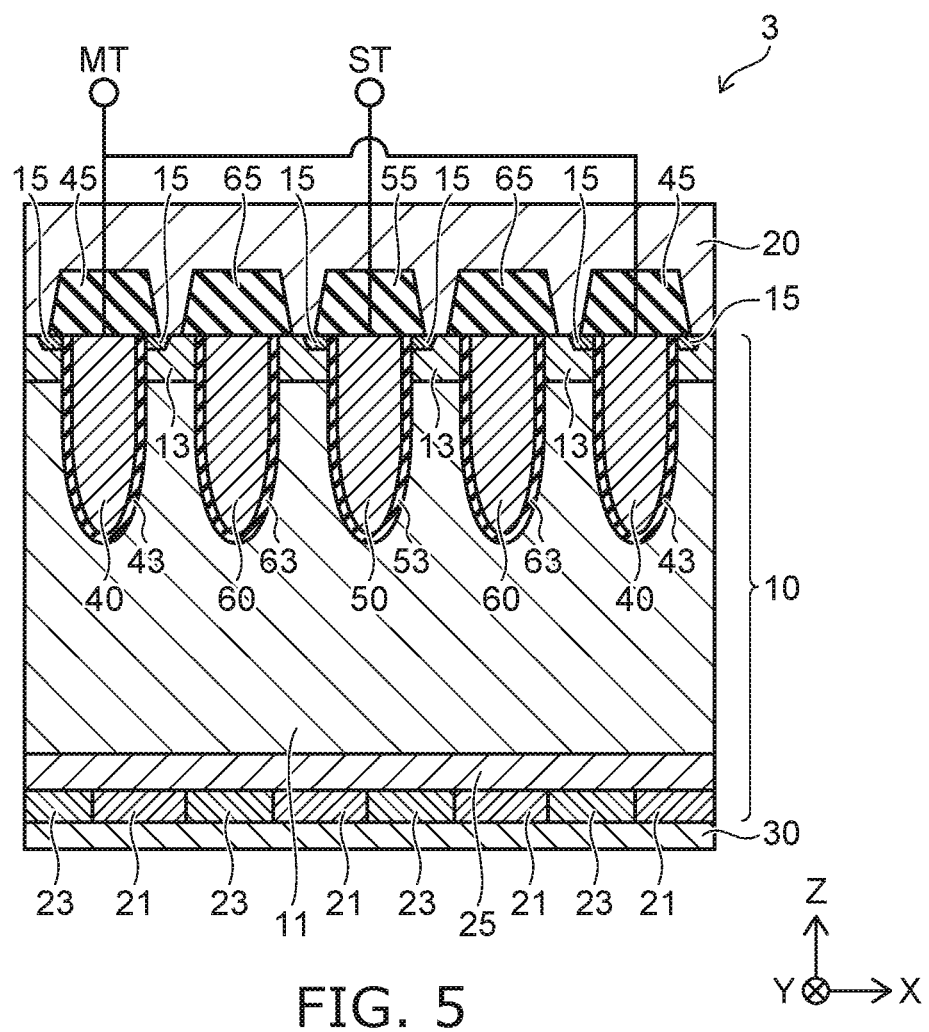
FIG. 5 is a schematic cross-sectional view showing a semiconductor device according to a first modification of the embodiment.

FIG. 5 is a schematic cross-sectional view showing a semiconductor device 3 according to a first modification of the embodiment. In the semiconductor device 3 as shown in FIG. 5, the third semiconductor layer 15 is located at a position contacting the first insulating film 43 and at a position contacting the second insulating film 53. In other words, the second control electrode 50 has the same gate structure as the first control electrode 40.

In the semiconductor device 3, for example, by applying a positive voltage to the second control electrode 50 in the diode mode, an n-type inversion layer can be induced at the interface between the second semiconductor layer 13 and the second insulating film 53, and the ejection of the electrons from the first semiconductor layer 11 to the first electrode 20 can be promoted. In other words, when the ejection of the electrons by the first control electrode 40 is insufficient, the densities of the holes and electrons in the first semiconductor layer 11 can be reduced by operating the second control electrode 50. The recovery time in the diode mode can be reduced thereby.

Figure 6:
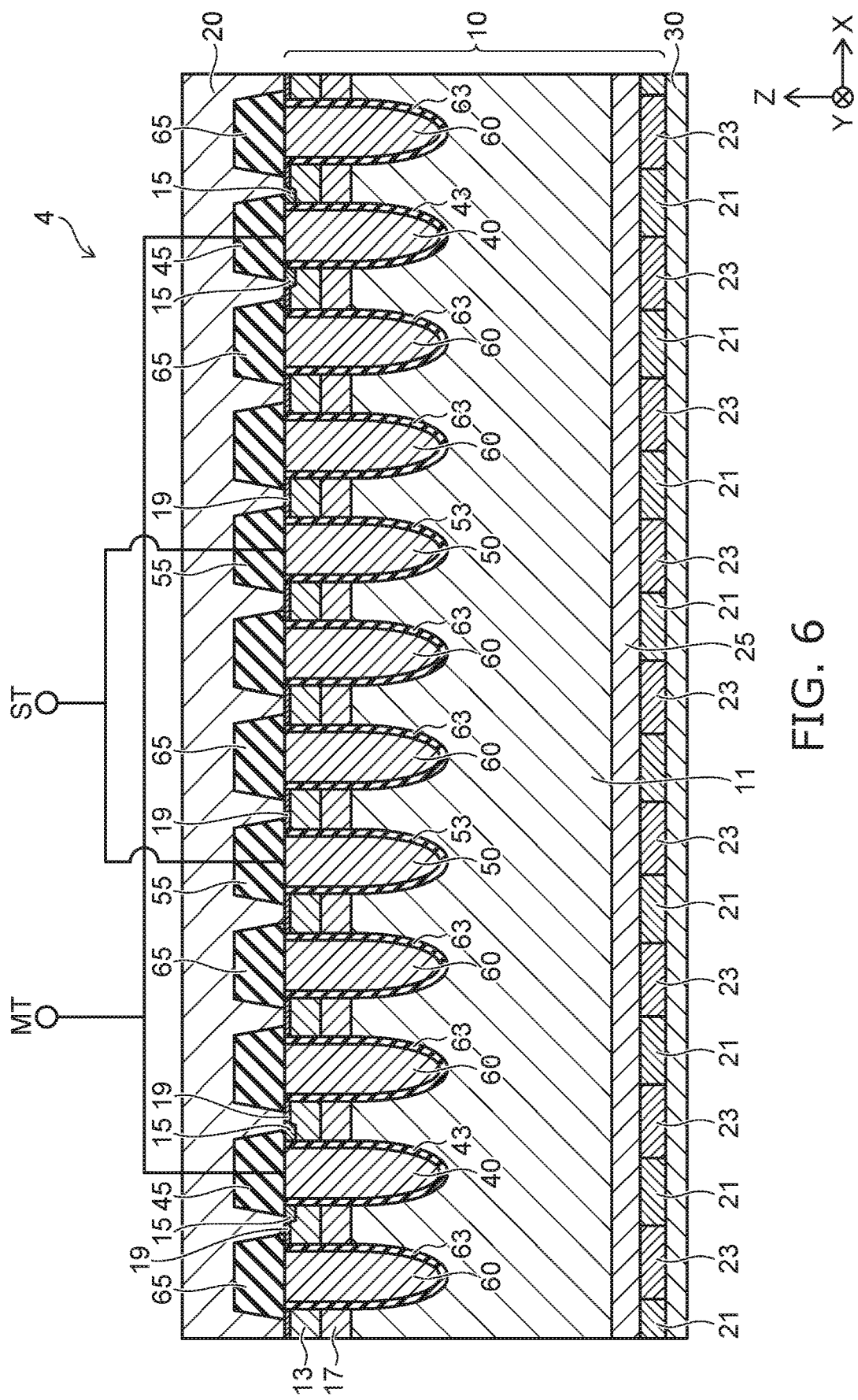
FIG. 6 is a schematic cross-sectional view showing a semiconductor device according to a second modification of the embodiment.

FIG. 6 is a schematic cross-sectional view showing a semiconductor device 4 according to a second modification of the embodiment. As shown in FIG. 6, the semiconductor device 4 has a structure in which two second control electrodes 50 are located between two first control electrodes 40. Also, two third control electrodes 60 are located between the first control electrode 40 and the second control electrode 50. Also, another two third control electrodes 60 are located between two second control electrodes 50.

For example, the arrangement of the control electrodes shown in FIG. 6 is periodically provided in the X-direction. The first control electrode 40 and the second control electrode 50 each are positioned between two adjacent third control electrodes 60.

The arrangement of the first control electrode 40, the second control electrode 50, and the third control electrode 60 is not limited to the embodiment described above, and is such that the conduction loss and the switching loss can be reduced by appropriately controlling the first control electrode 40 and the second control electrode 50. In the embodiment, at least one third control electrode is located between the first control electrode 40 and the second control electrode 50.

As shown in FIG. 6, an n-type seventh semiconductor layer 17 may be provided between the first semiconductor layer 11 and the second semiconductor layer 13. The seventh semiconductor layer 17 is a so-called barrier layer and includes an n-type impurity with a higher concentration than the n-type impurity of the first semiconductor layer 11. The seventh semiconductor layer 17 includes an n-type impurity with a lower concentration than the n-type impurity of the third semiconductor layer 15. For example, the seventh semiconductor layer 17 functions as a potential barrier to the holes of the first semiconductor layer 11 and increases the densities of the holes and electrons in the first semiconductor layer 11 in the on-state.

An eighth semiconductor layer 19 may be selectively provided between the second semiconductor layer 13 and the first electrode 20. The eighth semiconductor layer 19 is, for example, a p-type contact layer and includes a p-type impurity with a higher concentration than the p-type impurity of the second semiconductor layer 13. The eighth semiconductor layer 19 is arranged with the third semiconductor layer 15 between the second semiconductor layer 13 and the first electrode 20. For example, the eighth semiconductor layer 19 contacts the first electrode 20, and the first electrode 20 is electrically connected to the second semiconductor layer 13 via the eighth semiconductor layer 19.

The seventh semiconductor layer 17 and the eighth semiconductor layer 19 are not limited to the example, and are also applicable to the semiconductor part 10 of the semiconductor devices 1 and 2. The embodiments described above may have structures including one of the seventh semiconductor layer 17 or the eighth semiconductor layer 19.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A semiconductor device, comprising:
a semiconductor part including a first surface and a second surface, the second surface being at a side opposite to the first surface, the semiconductor part having first to third trenches provided in the first surface side of the semiconductor part;
a first electrode provided on the first surface of the semiconductor part;
a second electrode provided on the second surface of the semiconductor part;
a first control electrode provided between the semiconductor part and the first electrode, the first control electrode being provided in the first trench and electrically insulated from the semiconductor part by a first insulating film;
a second control electrode provided between the semiconductor part and the first electrode, the second control electrode being provided in the second trench and electrically insulated from the semiconductor part by a second insulating film;
a third control electrode provided between the semiconductor part and the first electrode, the third control electrode being provided in the third trench and electrically insulated from the semiconductor part by a third insulating film, the third control electrode being electrically isolated from the first and second control electrodes;
a first control terminal apart from the first electrode on the first surface of the semiconductor part, the first control terminal being electrically connected to the first control electrode and electrically insulated from the semiconductor part; and
a second control terminal apart from the first electrode and the first control terminal on the first surface of the semiconductor part, the second control terminal being electrically connected to the second control electrode and electrically insulated from the semiconductor part,
the first to third control electrodes being arranged in a direction along the first surface of the semiconductor part,
the third control electrode being provided between the first control electrode and the second control electrode,
the semiconductor part including a first semiconductor layer of a first conductivity type, a second semiconductor layer of a second conductivity type, a third semiconductor layer of the first conductivity type, and a fourth semiconductor layer of the second conductivity type,
the second semiconductor layer being provided between the first semiconductor layer and the first electrode, the second semiconductor layer including
a portion facing the first control electrode via the first insulating film,
a portion facing the second control electrode via the second insulating film, and
a portion facing the third control electrode via the third insulating film,
the third semiconductor layer being selectively provided between the second semiconductor layer and the first electrode, the third semiconductor layer contacting the first insulating film,
the fourth semiconductor layer being provided between the first semiconductor layer and the second electrode,
the first electrode being electrically insulated from the first control electrode by a fourth insulating film and electrically insulated from the second control electrode by a fifth insulating film, the first electrode being electrically connected to the second and third semiconductor layers,
the second electrode being electrically connected to the fourth semiconductor layer.
2. The device according to claim 1, wherein
the semiconductor part further includes a fifth semiconductor layer of the first conductivity type,
the fifth semiconductor layer is selectively provided between the first semiconductor layer and the second electrode, the fifth semiconductor layer including a first-conductivity-type impurity with a higher concentration than a concentration of a first-conductivity-type impurity in the first semiconductor layer,
the fourth semiconductor layer and the fifth semiconductor layer are arranged along the second surface of the semiconductor part, and
the second electrode is electrically connected to the first semiconductor layer via the fifth semiconductor layer.
3. The device according to claim 2, wherein
a plurality of the fourth semiconductor layers and a plurality of the fifth semiconductor layers are alternately provided along the second surface of the semiconductor part.

4. The device according to claim 2, wherein
the semiconductor part further includes a sixth semiconductor layer of the first conductivity type, the sixth semiconductor layer being provided between the first semiconductor layer and the fourth semiconductor layer and between the first semiconductor layer and the fifth semiconductor layer, and
the sixth semiconductor layer includes a first-conductivity-type impurity with a higher concentration than the concentration of the first-conductivity-type impurity in the first semiconductor layer.

5. The device according to claim 1, wherein
the semiconductor part further includes a sixth semiconductor layer of the first conductivity type, the sixth semiconductor layer is provided between the first semiconductor layer and the fourth semiconductor layer, and
the sixth semiconductor layer includes a first-conductivity-type impurity with a higher concentration than a concentration of a first-conductivity-type impurity in the first semiconductor layer.

6. The device according to claim 1, wherein
the first to third control electrodes each extend into the first semiconductor layer.

7. The device according to claim 1, wherein
a plurality of the third semiconductor layers is provided, and
the semiconductor part further includes the third semiconductor layer contacting the second insulating film.

8. The device according to claim 1, wherein
the third control electrode is electrically connected to the first electrode.

9. The device according to claim 8, further comprising:
a sixth insulating film provided between the first electrode and the third control electrode,
the first electrode being electrically connected to the third control electrode via a contact hole provided in the sixth insulating film.

10. The device according to claim 1, wherein
the semiconductor part further includes a seventh semiconductor layer of the first conductivity type, the seventh semiconductor layer being provided between the first semiconductor layer and the second semiconductor layer, and
the seventh semiconductor layer includes a first-conductivity-type impurity with a higher concentration than a concentration of a first-conductivity-type impurity in the first semiconductor layer.

11. The device according to claim 1, wherein
a plurality of the third control electrodes is provided, and
at least two of the plurality of third control electrodes are provided between the first control electrode and the second control electrode.

12. The device according to claim 11, wherein
the second semiconductor layer is provided between the two third control electrodes and further includes a portion facing each of the two third control electrodes via the third insulating film.

13. The device according to claim 11, wherein
the first control electrode is provided between two third control electrodes of the plurality of third control electrodes.

14. The device according to claim 11, wherein
the second control electrode is provided between two third control electrodes of the plurality of third control electrodes.

15. The device according to claim 1, wherein
the second semiconductor layer includes:
a first portion facing the first control electrode via the first insulating film, and facing the third control electrode via the third insulating film; and
a second portion facing the second control electrode via the second insulating film, and facing the third control electrode via the third insulating film.

16. The device according to claim 1, wherein
the semiconductor part includes an eighth semiconductor layer of the second conductivity type, the eighth semiconductor layer being selectively provided between the second semiconductor layer and the first electrode, the eighth semiconductor layer including a second-conductivity-type impurity with a higher concentration than a concentration of the second-conductivity-type impurity in the second semiconductor layer, and
the eighth semiconductor layer contacts the second semiconductor layer and is electrically connected to the first electrode.

17. The device according to claim 16, wherein
the third semiconductor layer and the eighth semiconductor layer are arranged along the first surface of the semiconductor part.

18. The device according to claim 1, further comprising:
a first control interconnect electrically connected to the first control electrode, the first control interconnect being electrically insulated from the semiconductor part by a seventh insulating film and connected to the first control terminal, and
a second control interconnect electrically connected to the second control electrode, the second control interconnect being electrically insulated from the semiconductor part by the seventh insulating film and connected to the second control terminal.

19. The device according to claim 18, wherein
the first control interconnect is electrically connected to the first control electrode via a contact hole provided in the fourth insulating film, and
the second control interconnect is electrically connected to the second control electrode via a contact hole provided in the fifth insulating film.

20. The device according to claim 18, wherein
the first to third control electrodes each extend in a first direction along the first surface of the semiconductor part, and
the first and second control interconnects each extend in a second direction crossing the first direction along the first surface of the semiconductor part.

* * * * *